United States Patent
Geiger et al.

(10) Patent No.: US 6,831,576 B2
(45) Date of Patent: Dec. 14, 2004

(54) A/D CONVERTER WITH IMPROVED RESOLUTION BY SAMPLING A SUPERPOSED SIGNAL

(75) Inventors: Albert Geiger, Eberdingen (DE); Reinhard Rieger, Brackenheim (DE); Michael Fehrenbach, Mittelstadt (DE); Juergen Landsgesell, Heilbronn (DE)

(73) Assignee: Robert Bosch GmbH, Stuttgart (DE)

( * ) Notice: Subject to any disclaimer, the term of this patent is extended or adjusted under 35 U.S.C. 154(b) by 0 days.

(21) Appl. No.: 10/713,335

(22) Filed: Nov. 13, 2003

(65) Prior Publication Data

US 2004/0135713 A1 Jul. 15, 2004

(30) Foreign Application Priority Data

Nov. 13, 2002 (DE) .......................................... 102 52 756

(51) Int. Cl.[7] .................................................. H03M 1/20
(52) U.S. Cl. ........................................ 341/131; 341/155
(58) Field of Search .................................. 341/131, 155, 341/120, 126

(56) References Cited

U.S. PATENT DOCUMENTS 5,621,518 A * 4/1997 Beller ......................... 356/73.1
6,545,627 B1 * 4/2003 He et al. ...................... 341/155

* cited by examiner

Primary Examiner—Michael Tokar
Assistant Examiner—Lam T. Mai
(74) Attorney, Agent, or Firm—Kenyon & Kenyon

(57) ABSTRACT

A method for improving the resolution of an A/D converter and/or a converter system having an S/H device and an A/D converter is described. In order to improve the resolution of the A/D converter, an auxiliary signal is superposed on an analog signal, and the superposed signal is sampled and converted into digital output values using the A/D converter. Based on the digital output values, it is possible to determine an output value having higher resolution, e.g., by averaging.

10 Claims, 5 Drawing Sheets

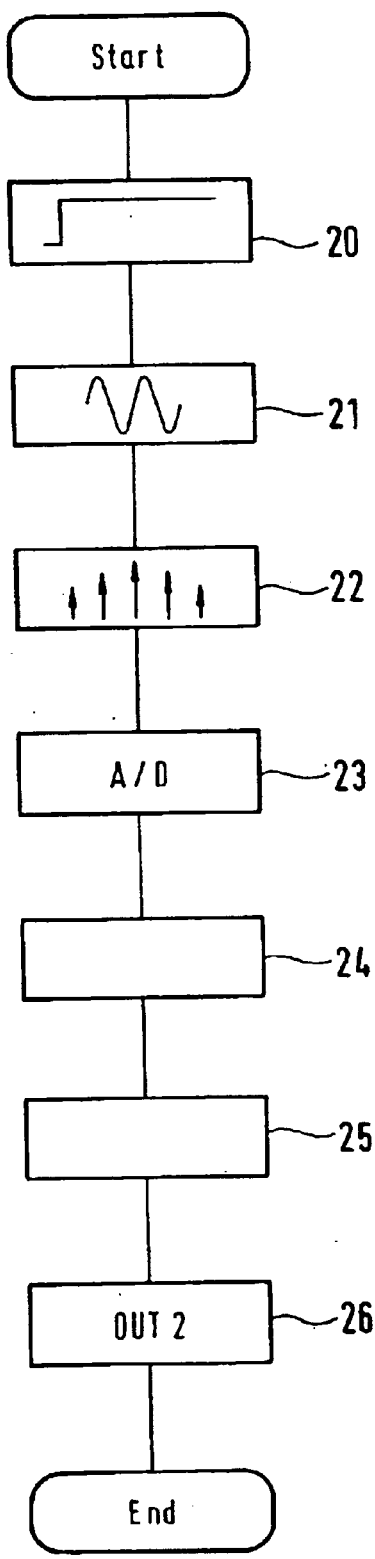

US 6,831,576 B2

A/D CONVERTER WITH IMPROVED RESOLUTION BY SAMPLING A SUPERPOSED SIGNAL

FIELD OF THE INVENTION

The present invention relates to a method for improving the resolution of an A/D converter, and an A/D converter system having an S/H device (S/H: sample/hold) and an A/D converter.

BACKGROUND INFORMATION

A/D converters (analog/digital converters) are the interface between analog and digital circuits and are used in a large number of applications, e.g., in microcontrollers and control units.

Known A/D converters, such as flash or pipeline converters, have a predetermined resolution, such as 8, 10, or 16-bit, for example, with which an analog value is converted to a binary value.

A typical A/D converter known from the related art is shown in FIG. 1 with reference numerals 4 and 5. FIG. 1 shows an A/D converter system with which an analog input signal 1 (e.g., an analog measured value) is converted to a digital output signal 7 (e.g., a digital 10-bit word). Analog input value 1 is first sampled by an S/H device 4, and sampled values 5 are each converted to a digital output signal 7 using an A/D converter 6.

The resolution is determined by the LSB (least significant bit) of A/D converter 6. A higher resolution can be attained only by using an A/D converter 6 having a higher resolution (e.g., 16-bit instead of 10-bit). To attain this, however, a substantially more complex A/D converter 6 having a substantially greater number of comparators is required, which would be correspondingly more expensive.

SUMMARY OF THE INVENTION

An object of the present invention, therefore, is to enhance the resolution of an existing A/D converter in a simple and cost-effective fashion.

According to the present invention, an auxiliary signal is superposed on an analog signal to be converted, to sample the superposed total signal using an S/H device, to convert the sampled values to digital output values using an A/D converter, and, based on a plurality of output values, to determine a binary output value having higher resolution. By superposing the auxiliary signal on the analog input signal, digital output values are produced that may differ from each other by at least one bit. Based on the number of output values having a higher bit value or the number of output values having a lower bit value, it is possible to determine, for example, in which bit resolution range the analog input signal is actually located. The resolution may thus be enhanced.

According to a first embodiment of the present invention, the superposed signal is sampled multiple times, and the sampled values are each converted to digital output values, the mean of the digital output values then being calculated. When n sampled values (e.g., n=8) are evaluated, it is possible to attain an additional resolution of $\sqrt{n+1}$ bit (3-bit). Since the superposed signal is to be sampled, however, the high-resolution output value is not available until after n sampling steps (e.g., n=8). The digital output values having the resolution predetermined by the A/D converter are still available in real time as before, however.

A high-resolution output value 10 may also be determined from the ratio of the number of output values 7 having a higher bit value, or the number of output values 7 having a lower bit value to the total number of output values 7 that were input.

The superposed signal is preferably sampled at a frequency that enables the recording of sampled values on the positive and the negative amplitude of the superposed signal. The sampling frequency is preferably selected so that a beat is produced with regard to the sampled values on the positive amplitude as well as the sampled values on the negative amplitude of the superposed signal.

The auxiliary signal preferably has a peak-to-peak amplitude that is greater than or equal to the resolution of the least significant bit (LSB) of the digital output values. If the peak-to-peak amplitude of the auxiliary signal is at least as great as the resolution of the LSB, the noise (e.g., thermal noise) of the A/D converter may be reduced. Furthermore, a portion of the linearity error of the A/D converter may be compensated.

The auxiliary signal added to the input signal is preferably a periodic signal, such as a sine or square-wave signal.

The sampling frequency of the S/H device is preferably approximately two-fold greater than the frequency of the auxiliary signal.

Accordingly, an A/D converter system for improving the resolution of an A/D converter includes a device for superposing an auxiliary signal on an analog signal, a superposed signal being produced, an S/H device for sampling the superposed signal, and an A/D converter that converts the sampled values to digital output values. The A/D converter system further includes a processing unit that determines, based on the digital output values, a digital output value having higher resolution, e.g., by averaging.

The device for superposing the auxiliary signal may include a capacitor or a current source, for example.

BRIEF DESCRIPTION OF THE DRAWINGS

FIG. 5 shows a flow chart depicting a superposition method for improving the resolution of an A/D converter according to the present invention.

DETAILED DESCRIPTION

Figure 1:
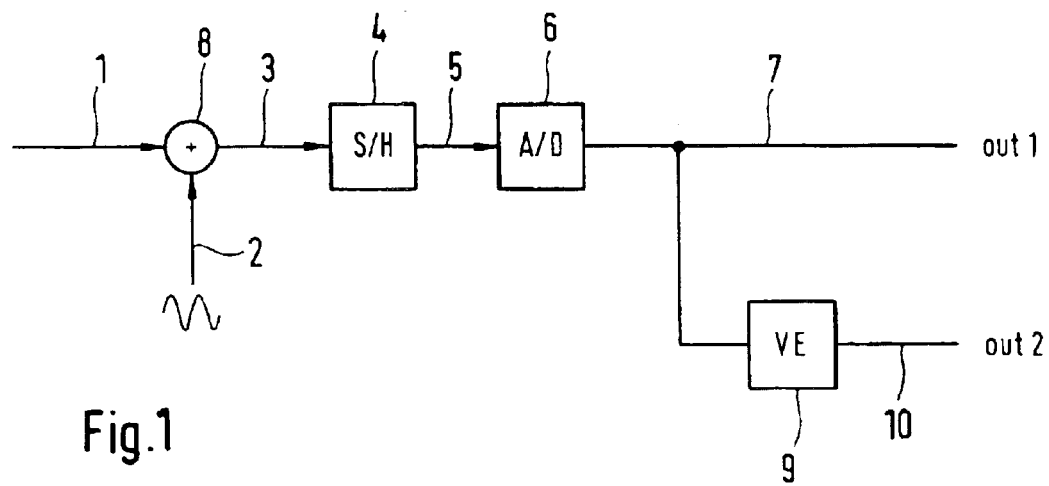
FIG. 1 shows an embodiment of an A/D converter system for improving the resolution of an A/D converter.

FIG. 1 shows an exemplary embodiment of an A/D converter system having an A/D converter 6 and an S/H device 4 for sampling and holding an analog input signal. This design corresponds to a conventional A/D converter known from the related art. With this design, the resolution is determined by the least significant bit (LSB). A higher resolution may be attained only by using an A/D converter 6 having a higher resolution.

In contrast to the related art, an auxiliary signal 2 is superposed on analog input signal 1 before sampling is carried out by S/H device 4. Auxiliary signal 2 is preferably a periodic signal, a sine signal in the present example. A superposing and/or adding device 8 is provided to carry out the superposition.

Figure 2:
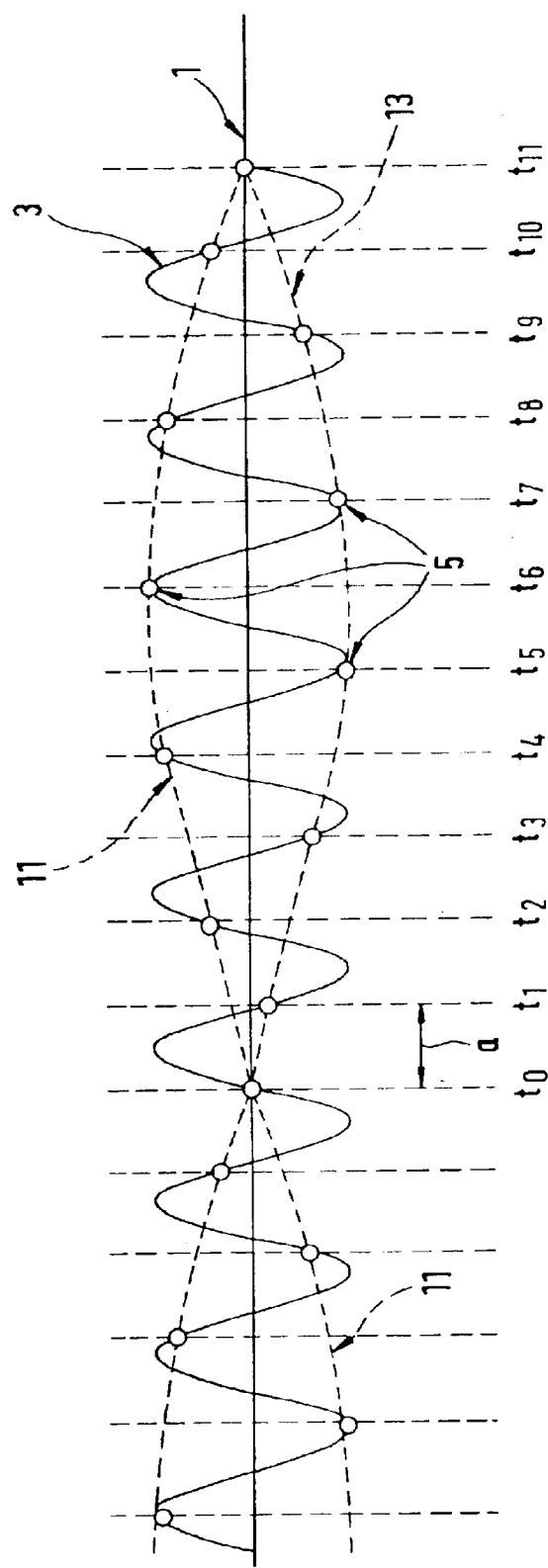
FIG. 2 shows a depiction of a superposed signal with sampled values.

The result of this signal superposition and the sampling is shown in FIG. 2. FIG. 2 shows a superposition signal 3 that was produced by adding an analog input signal 1 with a sinusoidal auxiliary signal 2. FIG. 2 further shows a plurality of sampled values 5 that are located on the positive amplitude and the negative amplitude of superposed signal 3. If the sampling frequency of S/H device 4 is selected in such a way that it is approximately twice as great as the frequency of auxiliary signal 2, a beat 11 is produced for sampled values 5 located on the positive amplitude of superposed signal 3 and sampled values 5 located on the negative amplitude of superposed signal 3. In other words, a beat 11 is produced when the duration of sampling interval a is of a similar order of magnitude as the duration of a half-period of superposed signal 3.

Finally, digitally converted sampled values 5 (=output values 7) are evaluated by a processing unit 9 and, e.g., averaged.

Figure 3A:
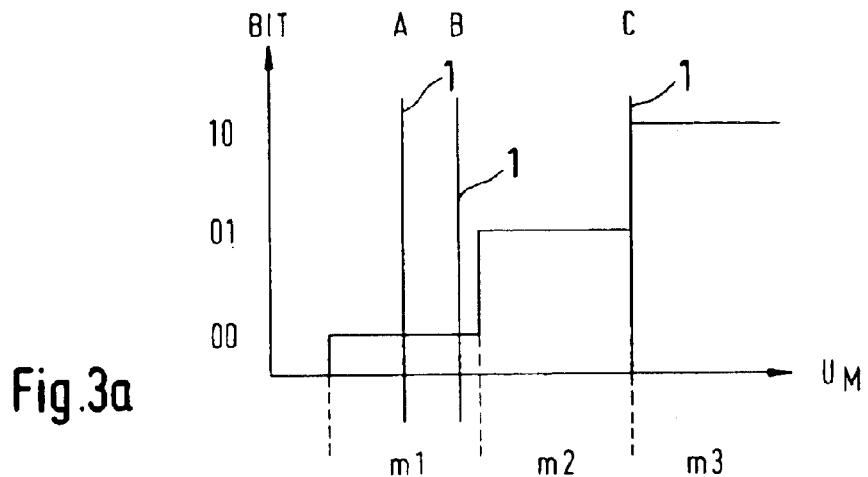
FIG. 3a shows a depiction of the bit resolution when measurement is carried out in conventional fashion.
Figure 3B:
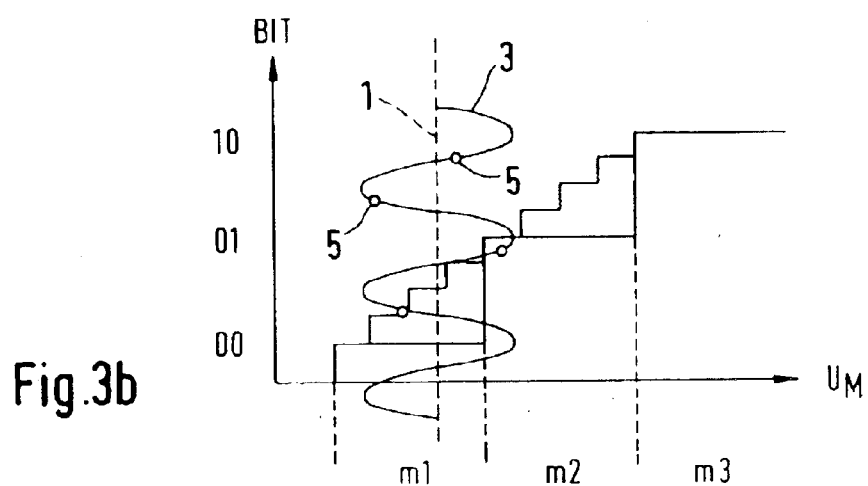
FIG. 3b shows a first depiction of the resolution when a superposition method according to the present invention is used.
Figure 3C:
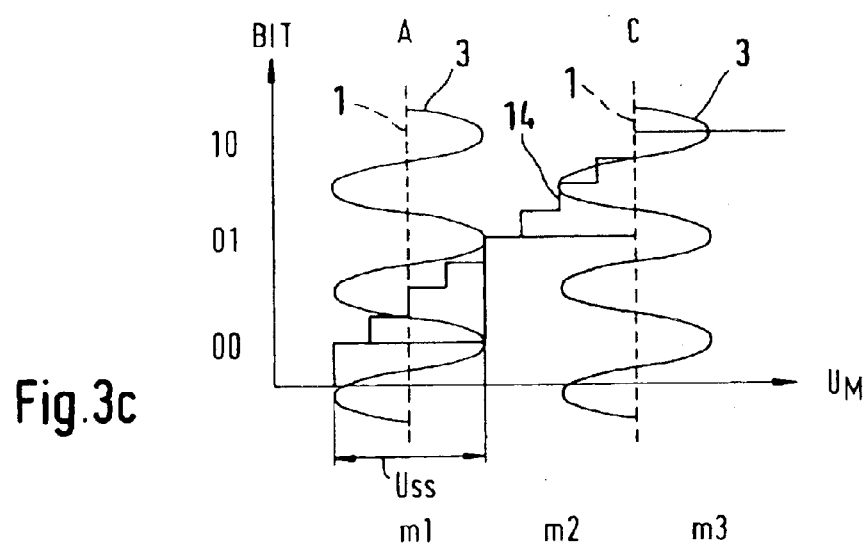
FIG. 3c shows a second depiction of the resolution when the superposition method according to the present invention is used.

FIGS. 3a–3c are graphs showing the effect attained by the superposition of signals, namely, the improved resolution of the A/D converter. FIG. 3a shows the last two bits of a digital output value 7 plotted against a measuring signal $U_M$.

In the example shown, A/D converter 6 has a resolution of 10 mV. In the 0 to 10 mV range, this results in a binary value 00 for the last two bits of digital output value 7; in a range of 10.01 mV–20 mV, this results in a combination 01 and, between 20.01 mV–30 mV, this results in a combination 10 of the last two bits. If the value of analog measuring signal 1 is 5 mV (reference symbol A), for example, this results in a combination 00 of the last two bits of the associated digital output value. At 9.9 mV (B), a combination 00 of the last two bits results as well. At 20 mV (C), the combination is 01.

FIG. 3b now shows the same depiction, but with a superposed signal 3. As indicated, superposed signal 3 contains sampled values 5 that correspond to a bit combination 00, and sampled values 5 that correspond to a bit combination 01. After the sampled values are digitally converted by A/D converter 6, output values 7 having a higher binary value and those having a lower binary value are obtained. Based on the number of output values 7 having a higher bit value or the number of output values having a lower bit value, it is possible to determine, for example, in which bit resolution range the analog input signal is actually located.

Processing unit 9 inputs digitally converted output values 7 produced in n sampling steps. The duration of the input period is preferably equal to at least a half-period of the period duration of beat 11.

A first possibility for determining a higher-resolution output value 10 is to enter a plurality of digital output values 7 and to average digital values 7. Another possibility is to determine high-resolution output value 10 from the ratio of the number of output values 7 having a higher bit value or the number of output values 7 having a lower bit value to the total number of output values 7 that were input.

In the case of FIG. 3b, there are three output values 7 having a digital value 00, and only one having a bit value 01.

The ratio of output values 7 having a digital value 00 to the total number of input values is ¾. This results in the fact that the analog input signal is approximately 7.5 mV. When n sampled values (e.g., n=8) are evaluated, an additional resolution of $\sqrt{n+1}$ bit (3-bit) may be attained.

In case A of FIG. 3c, the last two bits of all digital output values 7 have a binary value 00. From this it may be deduced that input signal 1 that is searched for is located exactly in the middle of the resolution range, that is, at approximately 5 mV. At the higher resolution, this corresponds to a value 0010.

The additional bits are labeled with reference numeral 14. In the present example, the resolution is increased by 2 bits. High-resolution output value 10 may now be represented by values 0000, 0001, 0010 and 0011, for example, the last two digits being the additional bits.

In case C, the number of digital output values 7 having a higher value is equal to the number of digital output values 7 having a lower value. From this it may be deduced that measured value 1 that is searched for is located exactly on the borderline between two resolution ranges m2, m3. High-resolution output value 10 is therefore assigned the binary designation 1000.

Peak-to-peak amplitude Uss is preferably greater than the resolution of a resolution range m1–m3. As a result, the value of analog input signal 1 may be determined relatively exactly when a relatively small number of output values 7 is taken into consideration.

Figure 4A:
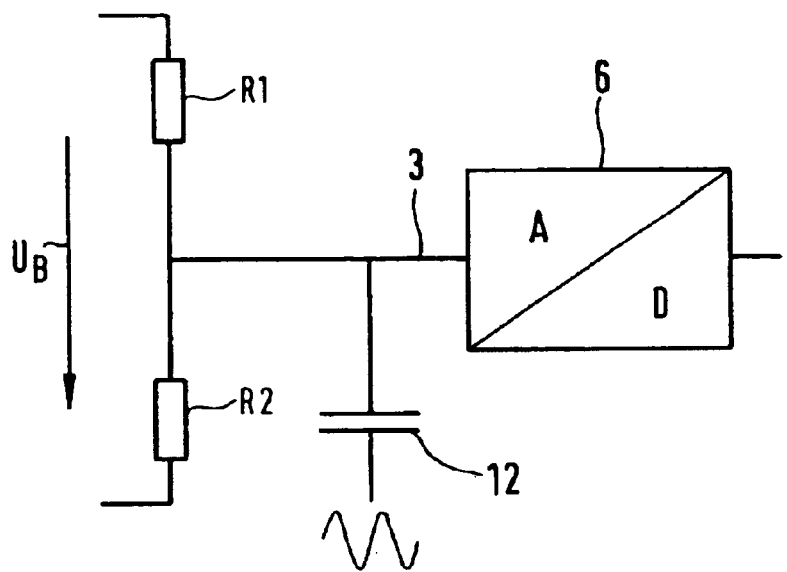
FIG. 4a shows a first embodiment of a system for supplying an auxiliary signal.

FIG. 4a shows a first exemplary embodiment of a circuit configuration for supplying an auxiliary signal 2. The circuit configuration includes a voltage divider R1, R2 that serves to divide the analog measured variable, such as a battery voltage $U_B$, into a value capable of being processed by A/D converter 6. Auxiliary signal 2 is supplied here via a capacitor 12 at the input of A/D converter 6, and it superposes the analog signal applied there.

Figure 4B:
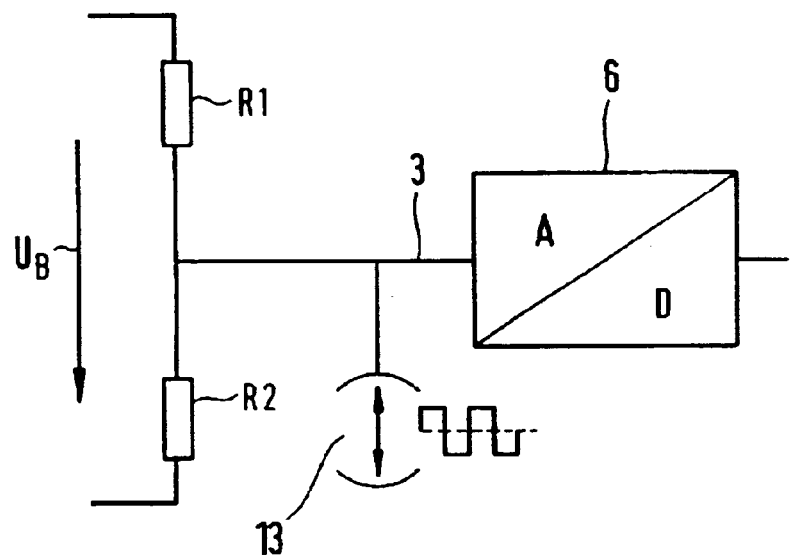
FIG. 4b shows a second embodiment of a system for supplying an auxiliary signal.

FIG. 4b shows another exemplary embodiment of a circuit for supplying an auxiliary signal 2, and the layout of the circuit is essentially identical to that shown in FIG. 4a. In this case, however, auxiliary signal 2 is supplied using a current source 13, the polarity of which is changed periodically. A square-wave signal is produced as a result, and the square-wave signal is superposed on the analog input signal.

FIG. 5 shows the main steps of a method for improving the resolution of an A/D converter. Initially, in step 20, an analog signal 1 is received and, in step 21, auxiliary signal 2 is superposed. Superposed signal 3 is sampled in step 22, and sampled values 5 are converted to binary output values 7 using A/D converter 6 (step 23). Output values 7 still have the resolution determined by A/D converter 6 (e.g., 10-bit).

In step 24, a predetermined number of digital output values 7 is input by processing unit 9 and, in step 25, a digital output value having high resolution is determined. This may take place, for instance, by averaging the digital output values 7 that were input, or by determining the ratio of the number of output values 7 having a higher or lower bit value to the total number of output values 7 that were input.

Finally, high-resolution output value 10 that is determined in this manner is output at output out2 in step 26. Output values 7 are preferably output as well (output out1).

List of Reference Numerals
1 Analog input signal
2 Auxiliary signal
3 Superposed signal
4 S/H device 5 Sampled values
6 A/D converter
7 Digital output values
8 Device for superposing signals
9 Processing unit
10 High-resolution output value
11 Beat
12 Capacitor
13 Current source
R1, R2 Resistors
$U_B$ Battery voltage
m1–m3 Resolution ranges
Uss Peak-to-peak amplitude

What is claimed is:

1. A method for improving a resolution of an A/D converter, comprising:

receiving an analog signal;

superposing an auxiliary signal on the analog signal, whereby a superposed signal is produced;

sampling the superposed signal using an S/H device, whereby sampled values are produced;

performing an A/D conversion of the sampled values, whereby a number of digital output values are produced; and determining a high-resolution digital output value based on the digital output values;

wherein the high-resolution digital output value is determined from a ratio of one of those of the digital output values having a higher bit value and those of the digital output values having a lower bit value to a total number of the digital output values that were input.

2. The method as recited in claim 1, wherein:

the high-resolution digital output value is determined by averaging the digital output values.

3. The method as recited in claim 1, wherein:

the auxiliary signal includes a periodic signal.

4. A method for improving a resolution of an A/D converter, comprising:

receiving an analog signal;

superposing an auxiliary signal on the analog signal, whereby a superposed signal is produced;

sampling the superposed signal using an S/H device, whereby sampled values are produced;

performing an A/D conversion of the sampled values, whereby a number of digital output values are produced; and determining a high-resolution digital output value based on the digital output values;

wherein the auxiliary signal has a peak-to-peak amplitude that is greater than or equal to a resolution of a least significant bit of the digital output values.

5. A method for improving a resolution of an A/D converter, comprising:

receiving an analog signal;

superposing an auxiliary signal on the analog signal, whereby a superposed signal is produced;

sampling the superposed signal using an S/H device, whereby sampled values are produced;

performing an A/D conversion of the sampled values, whereby a number of digital output values are produced; and determining a high-resolution digital output value based on the digital output values;

wherein the auxiliary signal includes one of a sine wave signal and a square-wave signal.

6. A method for improving a resolution of an A/D converter, comprising:

receiving an analog signal;

superposing an auxiliary signal on the analog signal, whereby a superposed signal is produced;

sampling the superposed signal using an S/H device, whereby sampled values are produced;

performing an A/D conversion of the sampled values, whereby a number of digital output values are produced; and determining a high-resolution digital output value based on the digital output values;

wherein a sampling frequency at which the superposed signal is sampled by the S/H device is selected in such a way that a beat is produced.

7. An A/D converter system, comprising:

a device for superposing an auxiliary signal on an analog signal, whereby a superposed signal is produced;

an S/H device for sampling the superposed signal, whereby sampled values are produced;

an A/D converter that converts the sampled values into binary output values; and a processing unit that determines a high-resolution output value based on the binary output values;

wherein the device for superposing the auxiliary signal includes one of a capacitor and a current source.

8. The A/D converter system as recited in claim 7, wherein:

the processing unit determines the high-resolution output value by averaging the binary output values.

9. An A/D converter system, comprising:

a device for superposing an auxiliary signal on an analog signal, whereby a superposed signal is produced;

an S/H device for sampling the superposed signal, whereby sampled values are produced;

an A/D converter that converts the sampled values into binary output values; and a processing unit that determines a high-resolution output value based on the binary output values;

wherein the processing unit determines the high-resolution digital output value from a ratio of one of those of the digital output values having a higher bit value and those of the digital output values having a lower bit value to a total number of the digital output values that were input.

10. The A/D converter system as recited in claim 9, wherein:

the device for superposing the auxiliary signal includes one of a capacitor and a current source.

* * * * *